US011519871B2

United States Patent
Klusáček et al.

(10) Patent No.: US 11,519,871 B2
(45) Date of Patent: Dec. 6, 2022

(54) METHOD OF EXAMINING A SAMPLE USING A CHARGED PARTICLE MICROSCOPE

(71) Applicant: FEI Company, Hillsboro, OR (US)

(72) Inventors: Jan Klusáček, Brno (CZ); Tomáš Tůma, Brno (CZ); Jiří Petřek, Brno (CZ)

(73) Assignee: FEI Company, Hillsboro, OR (US)

( * ) Notice: Subject to any disclaimer, the term of this patent is extended or adjusted under 35 U.S.C. 154(b) by 213 days.

(21) Appl. No.: 16/867,770

(22) Filed: May 6, 2020

(65) Prior Publication Data

US 2020/0355633 A1 Nov. 12, 2020

(30) Foreign Application Priority Data

May 6, 2019 (EP) ................................. 19172805

(51) Int. Cl.
*G01N 23/2254* (2018.01)
*G01N 23/203* (2006.01)
(Continued)

(52) U.S. Cl.
CPC ....... *G01N 23/2254* (2013.01); *G01N 23/203* (2013.01); *H01J 37/222* (2013.01);
(Continued)

(58) Field of Classification Search
CPC ............. G01N 23/2254; G01N 23/203; G01N 2223/045; G01N 2223/40;
(Continued)

(56) References Cited

U.S. PATENT DOCUMENTS

2014/0035943 A1* 2/2014 Statham ................ G06T 11/001
  345/593
2015/0122992 A1* 5/2015 Owen .................. G01N 23/225
  250/306
(Continued)

FOREIGN PATENT DOCUMENTS

EP 0568351 11/1993

OTHER PUBLICATIONS

Takeshi Tsuji et al, Mineral Classification from quantitative x-ray maps using neural network: application to volcanic rocks, Island Arc, vol. 9, No. 1, Mar. 23, 2010, pp. 105-119.
(Continued)

*Primary Examiner* — David A Vanore

(57) ABSTRACT

The invention relates to a method of examining a sample using a charged particle microscope, comprising the steps of providing a charged particle beam, as well as a sample, and scanning said charged particle beam over said sample. A first detector is used for detecting emissions of a first type from the sample in response to the beam scanned over the sample. Using spectral information of detected emissions of the first type, a plurality of mutually different phases are assigned to said sample. An image representation of said sample is provided, wherein said image representation contains different color hues. The color hues are selected from a pre-selected range of consecutive color hues in such a way that the selected color hues comprise mutually corresponding intervals within said pre-selected range of consecutive color hues.

18 Claims, 6 Drawing Sheets

(51) Int. Cl.
*H01J 37/22* (2006.01)
*H01J 37/28* (2006.01)

(52) U.S. Cl.
CPC ........ *H01J 37/28* (2013.01); *G01N 2223/045* (2013.01); *G01N 2223/053* (2013.01); *G01N 2223/08* (2013.01); *G01N 2223/40* (2013.01); *G01N 2223/507* (2013.01)

(58) Field of Classification Search
CPC ....... G01N 2223/507; G01N 2223/402; G01N 23/2251; G01N 23/041; G01N 23/20083; G01N 23/20091; G01N 23/2055; G01N 23/2206; G01N 2223/0566; H01J 37/222; H01J 37/28; H01J 37/244; H01J 2237/24495; H01J 2237/24578; G06T 11/001
See application file for complete search history.

(56) References Cited

U.S. PATENT DOCUMENTS

| | | | |
|---|---|---|---|
| 2018/0033591 A1* | 2/2018 | Stanfill | H01J 37/28 |
| 2020/0355633 A1* | 11/2020 | Klusáček | H01J 37/222 |
| 2020/0363349 A1* | 11/2020 | Klusáček | G01N 23/2206 |
| 2021/0033548 A1* | 2/2021 | Tuma | G01N 23/2206 |

OTHER PUBLICATIONS

Examiner's Search Report, dated Dec. 6, 2019, EP Application No. 19172805.4, Filed May 6, 2019.
Pawlowsky-Glahn, Egozcue, Tolosana-Delgado: Lecture Notes on Compositional Data Analysis (http://www.sediment.uni-goettingen.de/staff/tolosana/extra/CoDa.pdf.
Martin-Fernández, Josep A., et al. A measure of difference for compositional data based on measures of divergence. In: Proceedings of IAMG. 1999. p. 211-216.

* cited by examiner

METHOD OF EXAMINING A SAMPLE USING A CHARGED PARTICLE MICROSCOPE

FIELD OF THE INVENTION

The present description relates generally to methods and systems for examining a sample using a charged particle microscope.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for sample analysis.

Typically, in a SEM, backscattered electrons are detected by a solid state detector in which each backscattered electron is amplified as it creates many electron-hole pairs in a semiconductor detector. The backscattered electron detector signal is used to form an image as the beam is scanned, with the brightness of each image point determined by the number of backscattered electrons detected at the corresponding point on the sample as the primary beam moves across the sample. The image merely provides information on the topology of the sample to be examined.

In a process called "energy dispersive x-ray spectroscopy" or "EDS", the energies of x-rays coming from the sample in response to the electron beam are measured and plotted in a histogram to form a material specific spectrum. The measured spectrum can be compared to known spectra of various elements to determine which elements and minerals are present in said sample.

It is known to provide a set of colored images containing EDS information, wherein each colored image uses a different hue to represent a different phase. In this so-called Elemental Mapping technique, the user selects one or more phases that are relevant for the sample and assigns a desired color hue to each of those phases. This results in a set of images, each containing information about the relevant phase in a different hue. The set of colored images can be compared with the SEM image, to identify interesting regions. Interpretation of these images in a meaningful and consistent manner by a user is relatively difficult, however. To that end, it has been tried to combine different phases, and corresponding colors, into a single colored image. However, selecting the phases and assigning color hues in a meaningful and consistent way is difficult and rather time consuming.

It is thus an object to provide an improved method of examining a sample, wherein in particular the method provides an image of the sample with improved phase information.

SUMMARY

In one embodiment, a method of examining a sample using a charged particle microscope, comprises the steps of: providing a charged particle beam, as well as a sample; scanning said charged particle beam over said sample; detecting, using a first detector, emissions of a first type from the sample in response to the beam scanned over the sample; using spectral information of detected emissions of the first type, assigning a plurality of mutually different phases to said sample; associating, with reference to an HSV color space, a corresponding plurality of different color hues to said plurality of mutually different phases; and providing, by a control unit, an image representation of said sample, wherein said image representation contains said associated different color hues; characterized by the steps of: providing a pre-selected range of consecutive color hues; selecting said plurality of different color hues from said pre-selected range of consecutive color hues in such a way that the selected color hues comprise mutually corresponding intervals within said pre-selected range of consecutive color hues; and associating said selected color hues to said plurality of mutually different phases. In this way, the detected emissions may be displayed in a meaningful and consistent manner.

In another embodiment, a charged particle microscope for examining a sample, comprises: an optics column, including a charged particle source, a final probe forming lens and a scanner, for focusing a beam of charged particles emitted from said charged particle source onto a specimen; a specimen stage positioned downstream of said final probe forming lens and arranged for holding said specimen; a detector for detecting emissions from said specimen in response to the incidence of charged particles emitted from said charged particle source; a control unit and a processing device connected to said first detector, the control unit is configured to: provide a pre-selected range of consecutive color hues; scan said sample with the charged particle beam; detect emissions with the detector; assign a plurality of mutually different phases to said sample based on spectral information of the detected emissions; select a plurality of color hues from said pre-selected range; and associate said selected color hues to said plurality of mutually different phases.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION OF EMBODIMENTS

Figure 1:
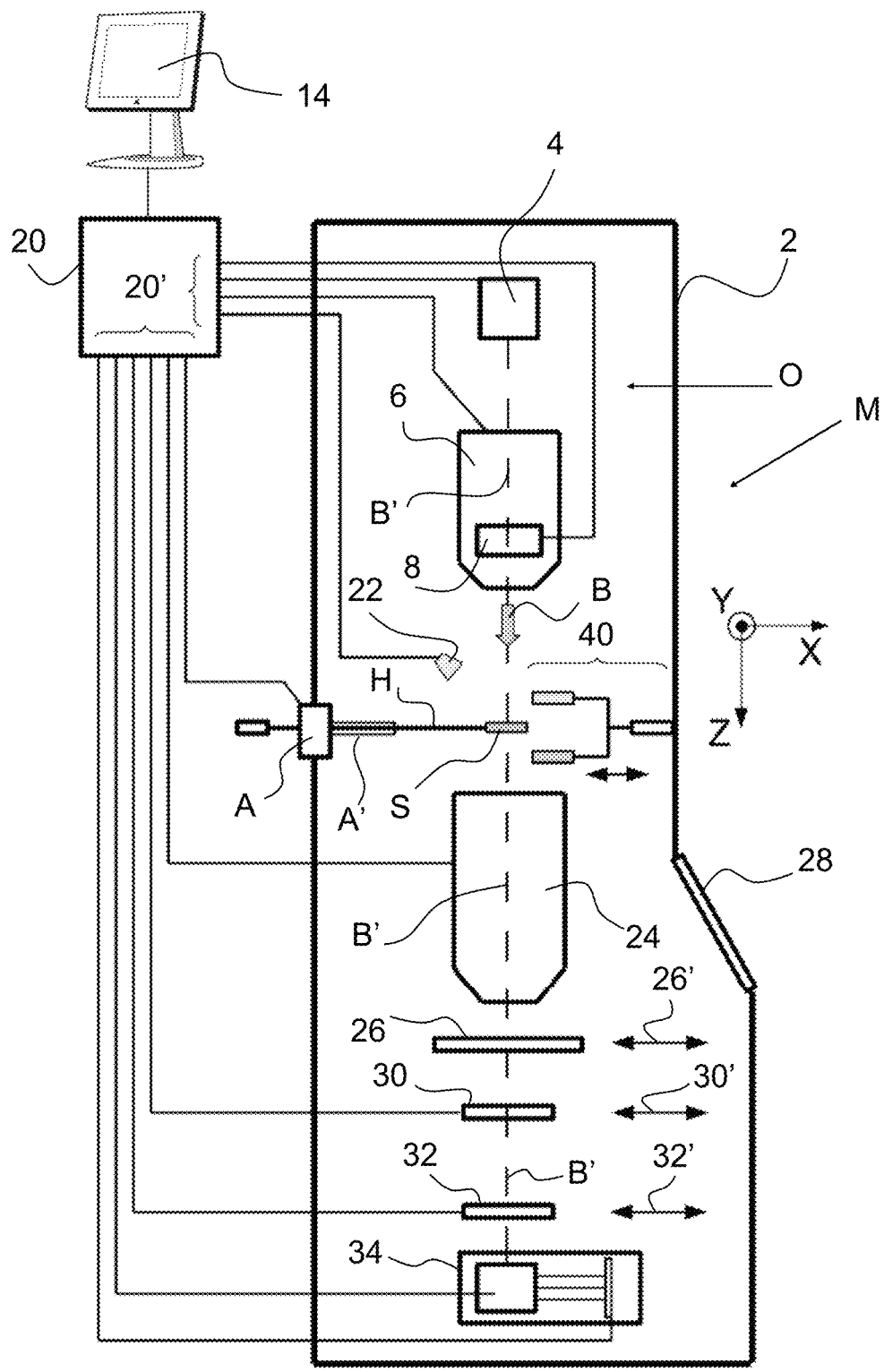
FIG. 1—shows a longitudinal cross-sectional view of a charged particle microscope according to a first embodiment of the invention.

A method of examining a sample using a charged particle microscope comprises the steps of providing a charged particle beam and scanning said charged particle beam over said sample. Emissions of a first type emanating from the sample in response to the charged particle beam being scanned over the sample are detected using a first detector. Then, a plurality of mutually different phases are assigned to said sample, wherein use is made of spectral information of detected emissions of the first type. As an example, the above described process of EDS may be used in this step to form a material specific spectrum and to determine which elements and minerals (i.e. phases) are present in said sample. Other methods of obtaining and using spectral information can be used as well.

As defined herein, the method further comprises the step of associating, with reference to an HSV color space, a corresponding plurality of different color hues to said plurality of mutually different phases. This means that different hues (e.g. green, red, orange, blue) are assigned to different phases (e.g. elements, chemical substance, minerals, etc.). The HSV color space is a color space that uses hue (often referred to as "color", e.g. red, green, blue), saturation (often referred to as the intensity or pureness of the color) and value (often referred to as lightness or darkness of the color) to describe attributes of a specific color. The HSV color space can be represented in a cylindrical geometry, with hue, its angular dimension, starting at the red primary at 0°, passing through the green primary at 120° and the blue primary at 240°, and then wrapping back to red at 360°. The central vertical axis comprises the neutral, achromatic, or gray colors, ranging from black at value 0, the bottom, to white at value 1, the top. With increasing radius, the saturation of the color increases.

In principle, any color can be described in the HSV color space regardless of the actual color space being used. Thus, the method as described herein is not limited to the use of a specific color space and can be applied in an RGB color space (since all RGB colors can be described with reference to an HSV color space as well) as well, or any other color space for that matter.

According to the method, a control unit is used to provide an image representation of said sample, wherein said image representation contains said associated different color hues. Hence, a control unit is used to provide information of the phases to the user, wherein said information is encoded in said different hues. Said image representation can be a single image, although the use of a plurality of images, or a data table containing image representation or the like, is conceivable as well. Said image representation preferably also contains different values and/or different saturations.

As defined herein, the method comprises the additional steps of providing a pre-selected range of consecutive color hues. The pre-selected range of consecutive hues are, with respect to the HSV color space, increasing or decreasing in hue value, i.e. increasing or decreasing in angular dimension, although they do not need to be provided or stored in an ordered way during pre-selection. It is noted that it is not required to provide a full angular range, i.e. not all color hues (red, purple, blue, green, yellow, orange, [red], and/or intermediates) need to be used in the pre-selected range of colors. For example, it is conceivable that a pre-selected range of color hues with limited angular value is provided, such as, for example, red, orange, yellow (i.e. 0° to 60°). In another embodiment, different variations of a single hue are provided, i.e. blueish green, green, and yellowish green (i.e. 90° to 150°).

Hence, the pre-selected range of consecutive colors comprises an angular hue range with reference to the HSV color space. In an embodiment, the pre-selected range of consecutive colors comprises the full angular hue range with reference to the HSV-space. In another embodiment the pre-selected range comprises a limited angular hue range with reference to the HSV-space.

According to the method, the step of associating, with reference to the HSV color space, a corresponding plurality of different color hues to said plurality of mutually different phases, comprises the steps of:

Selecting said plurality of different color hues from said pre-selected range of consecutive color hues in such a way that the selected color hues comprise mutually corresponding intervals within said pre-selected range of consecutive color hues; and Associating said selected color hues to said plurality of mutually different phases.

This way, the image representation of said sample contains said selected color hues with similar hue interval angles with reference to the HSV color space. The color hues are selected in such a way that the hue interval angles between the color hues that are ultimately associated and used is substantially equal from the starting color hue to the end color hue, ensuring that legibility of the final image(s) is increased and that interpretation of the results can be performed quickly and reliably by a user, as the difference between the different phases is directly visible. This is particularly true in case a single image is provided that contains multi-phase information, and more in particular when the number of phases shown in the final image is relatively high.

It is noted here that in case the full angular range (0° to 360°) is used, the hue interval angles is equal to about 360°/n, where n is the number of color hues used. In case only a limited angular hue range is used, the interval angle is determined accordingly, such that from starting color to end color a substantially equal interval angle is used.

In an embodiment, a fixed hue interval angle is used for each additional phase, wherein the fixed hue interval angle is equal to the golden angle. By using the golden angle (approximately 137.5°) to select an additional color hue for each additional phase, it is ensured that—no matter how many phases need to be associated—all hues are selected in such a way that the next color is selected from the largest unused gap and the colors will not repeat for as long as possible given the model.

Thus, the above method may make use of mapping the topology of an HSV color space to a higher-dimensional data space of phases in a defined way. With the method it is possible to create informative, consistent, more legible color images containing relevant information on the sample being examined. By using this method, the images are visually pleasing to the user as well. With this, the object of the invention is achieved.

Advantageous embodiments will be explained below.

In an embodiment, the step of selecting said plurality of different color hues comprises using information on the plurality of mutually different phases as an input variable. The information may contain the number of detected phases in the sample, which is useful in determining the hue interval angle. This information may also comprise the number of phases that are distinct, meaning that phases that are similar, or somewhat similar are grouped together and are assigned a single hue, or similar hue. Similar phases may be phases that have a similar composition as they comprise one or more chemical elements that are the same, such as for example It is noted that these, or compatible hues.

In an embodiment, the step of providing a pre-selected range of consecutive color hues may comprise the step of assigning one or more of the pre-selected color hues to a corresponding one or more phases. This step may be performed by the control unit. The step may be initiated by said control unit or by a user. This way it is possible, for example, to assign a blue hue to silicon, a purple hue to oxygen, and an orange hue to platinum, for example. Hence, it is possible to determine certain boundary conditions for the color hues that are eventually used. This provides consistency between different samples and different experiments, with which the user can more easily interpret the results of the sample. The boundary conditions of pre-assigning certain hues to different phases obviously set some limits on the hue interval angles that can be obtained with this embodiment, meaning that not all hue interval angles need to be equal or similar. However, given these boundary conditions, the method preferably selects additional hues for additional phases in such a way that the selected color hues comprise mutually corresponding intervals within said pre-selected range of consecutive color hues.

In an embodiment, the method comprises the step of repeating said steps of selecting said plurality of different color hues, and associating said re-selected color hues to said plurality of mutually different phases. Said step of repeating may be initiated by the control unit, or by the user. Re-selecting may be done during data acquisition of the sample, for example. As more data is coming in, additional phases may be detected, and the color hues may be re-selected based on that. Re-selecting may additionally or alternatively be done after setting or changing a boundary condition by the user, for example. It is conceivable for example that given the initial result, the user wants to assign a certain hue to a certain phase (or composition), requiring a change of other selected color hues. This step of repeating may also comprise the step of providing a further pre-selected range of consecutive color hues, wherein the pre-selected range of consecutive color hues is different from the initially provided pre-selected range of consecutive color hues. It is conceivable for example that a wider or smaller angular hue range is used during the repeated step of selecting and associating.

In an embodiment, said emissions of said first type are used to encode different saturations within said image representation.

In an embodiment, a second detector is used for detecting emissions of a second type different from said first type. Said emissions of said second type may, for example, be secondary electrons and/or backscattered electrons. Said emissions of said second type are used to encode different values within said image representation. In other words, SEM is used to obtain a gray-scale image of the sample being examined, and color is used, preferably on top of that image, to encode the emissions of the first type, preferably related to EDS, within said image representation.

In an embodiment, the method comprises the step of using an algorithm for selecting and associating said plurality of different color hues.

Said algorithm may, in an embodiment, comprise one or more of the following steps:

Providing an initial color scheme;
Providing one or more adjustment variables;
Generating a final color scheme and using this final color scheme to provide an image representation of said sample.

Said adjustment variables may comprise one or more preferences, such as global preferences and/or user preferences. Said adjustment variables may also comprise negative adjustment values and positive adjustment values that are used to change one or more of the preferences. For example, the composition of the sample may be used to generate an adjustment value that changes the global preferences into a final preference, with which a final color scheme is generated.

It is noted that the algorithm described above makes use of the pre-selected range of consecutive color hues (i.e. initial color scheme), and selects relevant colors (i.e. final color scheme) based on one or more adjustment variables as boundary conditions for selecting the final color scheme. The selected colors may provide mutual corresponding hue interval angles, although it is conceivable that the hue interval angles are not substantially corresponding. According to an aspect, therefore, a method of examining a sample using a charged particle microscope, comprising the steps of:

Providing a charged particle beam, as well as a sample;
Scanning said charged particle beam over said sample;
Detecting, using a first detector, emissions of a first type from the sample in response to the beam scanned over the sample;
Using spectral information of detected emissions of the first type, assigning a plurality of mutually different phases to said sample;
Associating, with reference to an HSV color space, a corresponding plurality of different color hues to said plurality of mutually different phases; and
Providing, by a control unit, an image representation of said sample, wherein said image representation contains said associated different color hues;

Characterized by the steps of:
Providing a pre-selected range of consecutive color hues;
Providing one or more adjustment variables, using at least spectral information of detected emissions of the first type;
Selecting said plurality of different color hues from said pre-selected range of consecutive color hues based on said adjustment variables; and
Associating said selected color hues to said plurality of mutually different phases.

By using such an algorithm, it is ensured that a suitable color scheme is used for creating a colored image representation that is relevant, informative, consistent, and more legible. Many modifications of such an algorithm are conceivable, and some embodiments will be described by means of the embodiments in the accompanying drawings. First however, several other embodiments of the method as disclosed herein will be described.

In an embodiment, the method comprises the step of using an artificial neural network (ANN) for selecting and associating said plurality of different color hues. An ANN may be advantageously used to select and associate the relevant color hues based on the available data and is relatively effective in that.

In an embodiment, the method comprises the step of using a self-organizing map (SOM) as said artificial neural network.

In an embodiment, different nodes of said ANN represent different phases. An outer edge of said ANN may correspond to said pre-selected range of consecutive color hues. With reference to an HSV color space, said ANN comprises at least information with respect to hue and saturation. It is furthermore conceivable that the method comprises the step of initializing said ANN to include a number of pre-selected phases as corresponding pre-selected nodes.

In an embodiment, the method comprises the step of training said ANN, wherein said step of training in particular comprises the step of matching said ANN to said assigned plurality of mutually different phases.

In an embodiment, the method comprises the step of pre-assigning a specific color hue to a specific phase.

In an embodiment, the method comprises the step of normalizing color properties based on information on the plurality of mutually different phases.

According to an aspect, a charged particle microscope for examining a sample is provided, wherein said charged particle microscope comprises:
  an optics column, including a charged particle source, a final probe forming lens and a scanner, for focusing a beam of charged particles emitted from said charged particle source onto a specimen;
  a specimen stage positioned downstream of said final probe forming lens and arranged for holding said specimen;
  a first detector for detecting emissions of a first type originating from said specimen in response to the incidence of charged particles emitted from said charged particle source; and
  a control unit and a processing device connected to said first detector.

As defined herein, said charged particle microscope is arranged for executing the method as described above, in particular since said control unit and/or said processing unit are arranged for performing at least parts of said method.

In an embodiment, said charged particle microscope further comprises a second detector for detecting emissions of a second type originating from said specimen in response to the incidence of charged particles emitted from said charged particle source.

In an embodiment, said charged particle microscope further comprises an output device for outputting a combination of processed first detector information and of processed second detector information. In particular, said output device is arranged for outputting a colored image, wherein a color space of said colored image comprises hue, value and saturation, and wherein:
  emissions of the first type (e.g. EDS data) are used for defining at least one of hue and saturation of the colored image; and
  emissions of the second type (e.g. SEM data) are used for defining at least value of the colored image.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:
  TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X, Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M according to the invention, and of which an embodiment is shown in FIG. 1, thus comprises an optics column O, including a charged particle source 4, a final probe forming lens 6 and a scanner 8, for focusing a beam B of charged particles emitted from said charged particle source 4 onto a specimen. The apparatus further comprises a specimen stage A, H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is the analysis device 22, which—as mentioned before—might be a combined scintillator/photomultiplier or EDS (Energy-Dispersive X-Ray Spectroscopy) module. In a preferred embodiment, said first detector is an EDS. Furthermore, the apparatus according to the invention comprises the control device 20 that is connected (by means of lines 20') to said first detector 22 (schematically shown). According to the invention, said charged particle microscope M is arranged for executing the method according to the invention, which will later be explained by means of FIG. 3 to FIG. 8.

Figure 2:
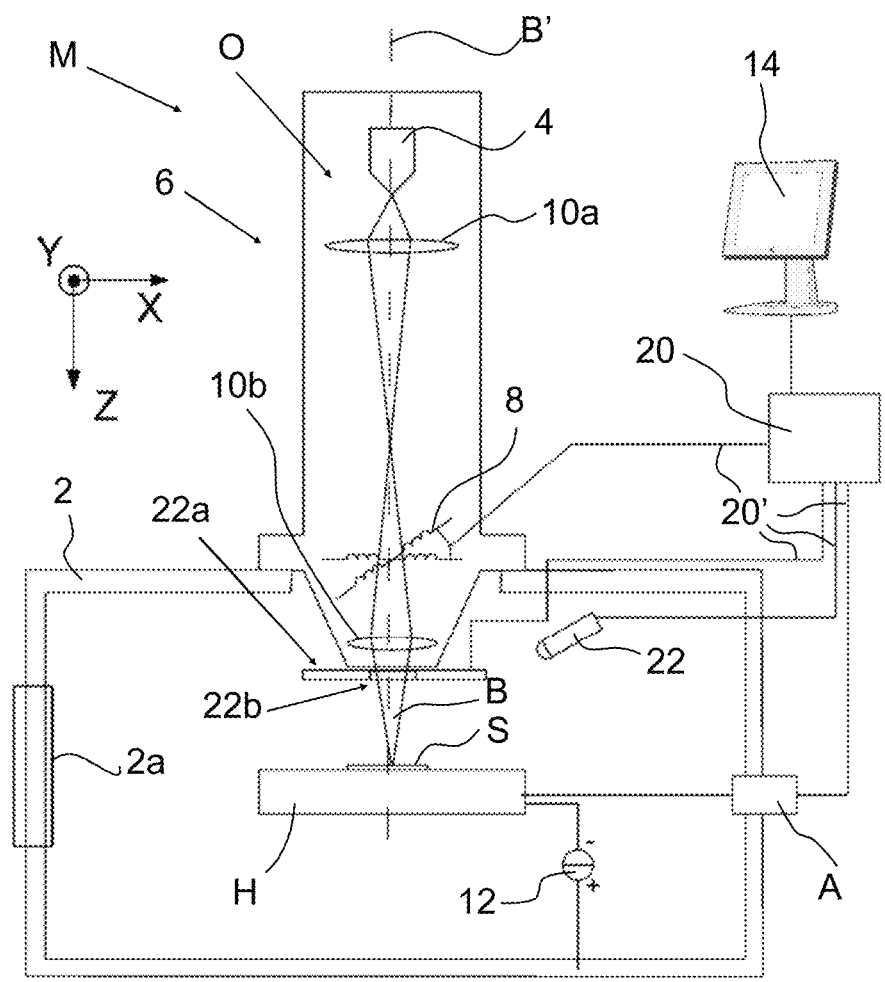
FIG. 2—shows a longitudinal cross-sectional view of a charged particle microscope according to a second embodiment of the invention.

Now first referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

14: A display, such as a FPD or CRT;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Thus the charged particle microscope M as shown in FIG. 2 comprises an optics column O, including a charged particle source 4, a final probe forming lens 6, 10a, 10b and a scanner 8, for focusing a beam B of charged particles emitted from said charged particle source 4 onto a specimen S. The apparatus further comprises a specimen stage A, H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is said analysis device 22, which—as mentioned before—might be a combined scintillator/photomultiplier or EDS (Energy-Dispersive X-Ray Spectroscopy) module. In an alternative embodiment, the first detector 22 may be the segmented detector 22a, 22b. In a preferred embodiment, said first detector is an EDS. Furthermore, the apparatus according to the invention comprises said control device 20 that is connected (by means of lines 20') to said first detector 22.

The apparatus shown in FIG. 1 and FIG. 2 may be used in examining a sample with a method according to the invention. In general, embodiments of the method all comprise the general steps of:

Scanning said charged particle beam B over said sample S;

Detecting, using the first detector 22, emissions of a first type from the sample S in response to the beam B scanned over the sample S;

Using spectral information of detected emissions of the first type, assigning a plurality of mutually different phases to said sample;

Associating, with reference to an HSV color space, a corresponding plurality of different color hues to said plurality of mutually different phases; and Providing, by a control unit 20, an image representation of said sample, wherein said image representation contains said associated different color hues.

The method as disclosed herein further comprises the steps of:

Providing a pre-selected range of consecutive color hues;

Selecting said plurality of different color hues from said pre-selected range of consecutive color hues in such a way that the selected color hues comprise mutually corresponding intervals within said pre-selected range of consecutive color hues; and Associating said selected color hues to said plurality of mutually different phases.

The above method steps will be explained in further detail below.

Figure 3:
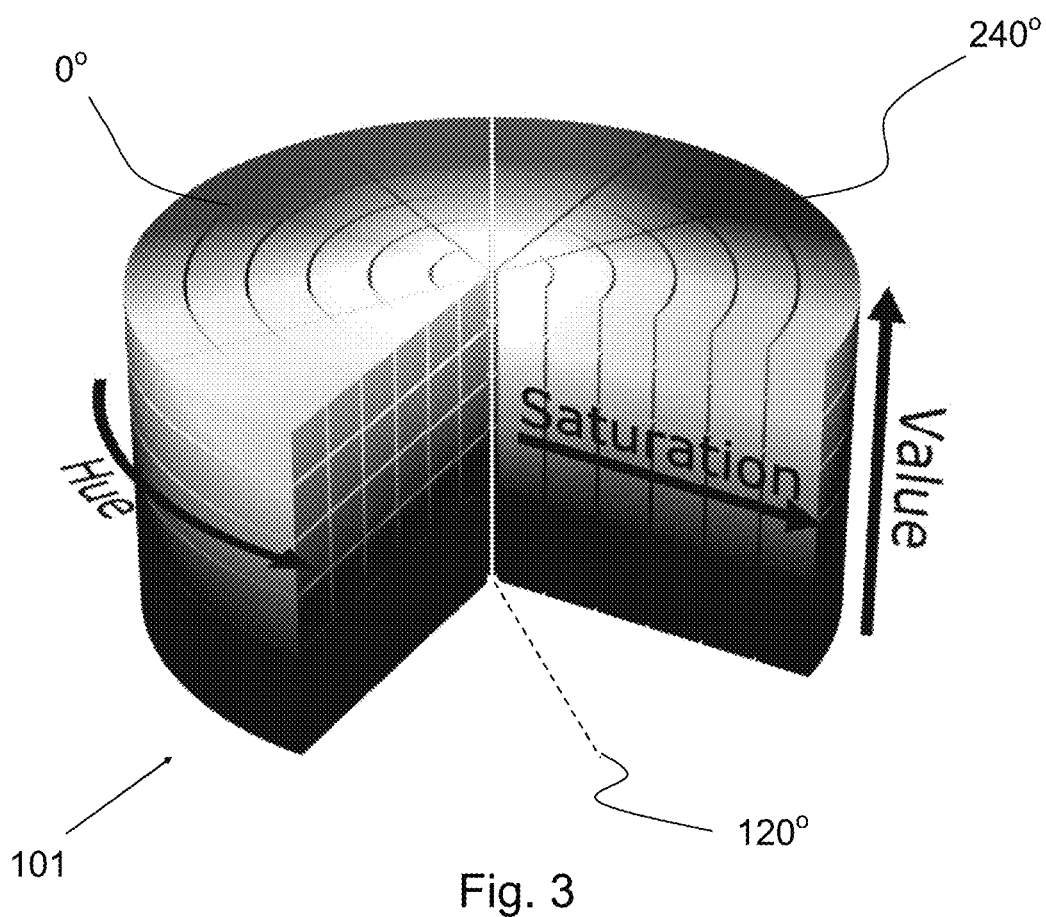
FIG. 3—shows a representation of the HSV color space.

FIG. 3 shows an example of the HSV color space 101 that is used in the method as defined herein. The HSV color space 101 is a color space that uses hue (often referred to as "color", e.g. red, green, blue), saturation (often referred to as the intensity or pureness of the color) and value (often referred to as lightness or darkness of the color) to describe attributes of a specific color. The HSV color space can be represented in a cylindrical geometry as shown in FIG. 3, with hue, its angular dimension, starting at the red primary at 0°, passing through the green primary at 120° and the blue primary at 240°, and then wrapping back to red at 360°. The central vertical axis comprises the neutral, achromatic, or gray colors, ranging from black at value 0 (bottom part in FIG. 3), to white at value 1 (top part of FIG. 3). With increasing radius, i.e. from the center outwards, the saturation of the color increases. Details of the HSV color space are known per se to those skilled in the art of color spaces.

Figure 4:
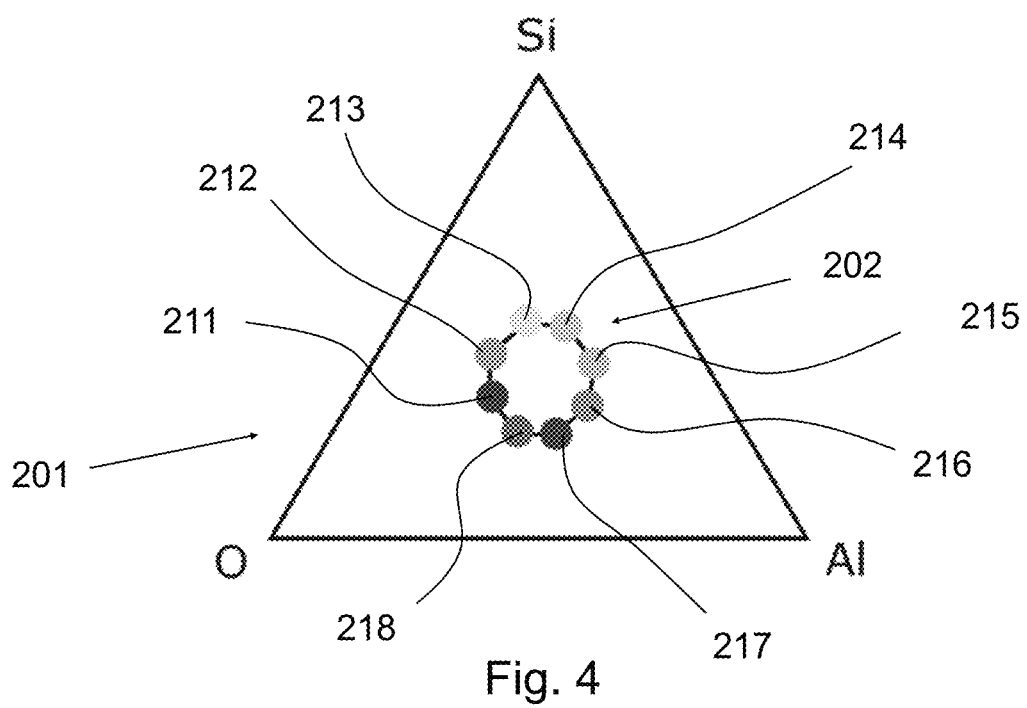
FIG. 4—shows a first embodiment of selecting and assigning color hues to phases.

FIG. 4 shows an embodiment of how a plurality of different color hues can be assigned to a plurality of mutually different phases. In this embodiment, a charged particle beam and a sample were provided, and the charged particle beam was scanned over said sample. Emissions of a first type, such as x-rays, of the sample were detected. Based on those detected emissions the mutually different phases oxygen (O), aluminum (Al) and silicon (Si) were assigned to said sample.

FIG. 4 shows a schematic image representation of part of the color space 201 that can be used for providing an image representation of the sample that was examined. Here it can be seen that a pre-selected range 201 of a total of eight consecutive color hues 211-218 is provided, wherein the following color hues are used:

211—red;
212—orange;
213—yellow;
214—green;
215—blue-green;
216—blue;
217—violet; and
218—purple.

Based on the pre-selected range of consecutive colors, and the available different phases, the plurality of different color-hues can be selected. Selection is done in such a way that the selected color hues comprise mutually corresponding intervals within said pre-selected range of consecutive color hues. In the embodiment shown, the colors red 211, yellow 213 and blue 216 are selected. These colors have substantially equal hue interval angles, with reference to the HSV-color space, within said pre-selected range of consecutive color hues. In the embodiment shown, the color red 211 is then assigned to oxygen, the color yellow 213 is assigned to silicon, and the color blue 216 is assigned to aluminum. As an alternative, it is conceivable that red 211 is assigned to aluminum, yellow 213 to oxygen, and blue 216 to silicon.

Assigning of the selected color hues to the different phases may be done at random, or in a more structured manner, using an algorithm (see also description of FIG. 8) for example. It is conceivable, for example, that boundary conditions are provided, either by the control unit or by the user. These boundary conditions may include a required color hue for a specific phase, such as that the color hue red 211 needs to be assigned to oxygen (O). This way, a specific color hue can be pre-assigned to a specific phase. Based on those boundary conditions, additional colors can be selected from the pre-selected list of color hues.

As an alternative, it is conceivable that, as a first color, any arbitrary color hue is selected from said pre-selected range of consecutive color hues. It is not required to select the first color hue in the pre-selected range of consecutive color hues. For example, it is conceivable that color hues orange 212, green 214 and purple 217 are selected for O, Si and Al, as these color hues exhibit substantially equal hue interval angles as well.

As an alternative, it is conceivable that subsequent color hues within said pre-selected range of colors are used. For example, it is conceivable that color hues orange 212, yellow 213, and green 214 are used for Si, O, and Al, as these color hues exhibit substantially equal hue interval angles as well.

Figure 5:
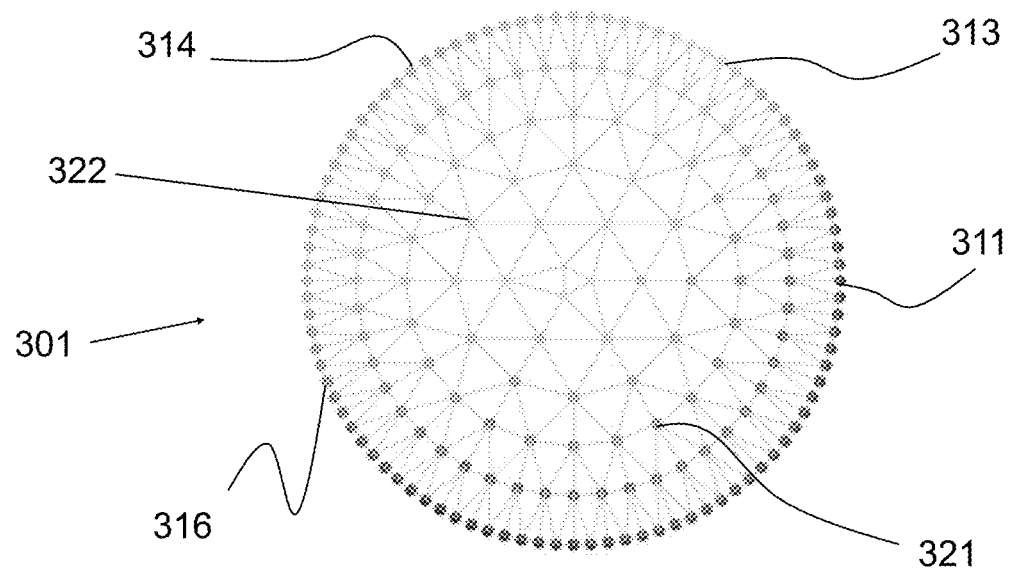
FIG. 5—shows the use of an artificial neural network for selecting and assigning color hues to phases.

FIG. 5 shows how an artificial neural network (ANN) can be useful for selecting and associating the plurality of different color hues. FIG. 5 shows a color space 301 generated by such an ANN, which can be a self-organizing map (SOM) in an embodiment. This way, the chemical compositions can be mapped onto a network of nodes (311-316, 321, 322) that respect their mutual dependencies given by a color model. The network can be adapted according to incoming data, i.e. when additional data is detected by the detector. Such an ANN, in particular a SOM, can in general be useful for generating and selecting color-hues to be used in an image representation of the sample. Main advantages are that the ANN can be used and programmed to reflect the (dis)similarities in phase composition:

Phases with similar composition should have similar colors;

Phases that overlap should have colors adjacent on the color wheel to enable mixing;

Two dissimilar phases should not get a similar color; and

A distinct phase (different from all the other phases) should have a distinct color.

Further, it is possible to add boundary conditions to ensure that the ANN produces consistent results across experiments. For example, it is desirable that a certain phase, such as Copper, gets the same color regardless of the surroundings. Thus, it is possible that the ANN is initialized to include a number of pre-selected phases as corresponding pre-selected nodes.

Additionally, the ANN can be programmed to adapt specifically to the data available. This way, it is possible, for example, to prevent colors from being allocated in case certain phases are not present in the scene, or to allocate them to different phases instead. Ultimately, it is desirable to utilize color hues across the whole color space in a final image representation of the sample, as this provides a way of conveying technical information to the user in a most legible and information dense manner. Hence, the ANN can be programmed for selecting said plurality of different color hues from said pre-selected range of consecutive color hues in such a way that the selected color hues substantially comprise mutually corresponding intervals within said pre-selected range of consecutive color hues. It is of course conceivable that not all color hues have corresponding hue interval angles, due to the presence of certain boundary conditions.

Additionally, similar phases can be given similar, compatible colors. Thus it is conceivable in an embodiment that generally two distinct phases are present, phase A and phase B. For these two distinct phases, two opposite color hues, such as orange and blue, can be selected. Phase A is thus represented by color hue blue, and phase B is represented by color hue orange. However, several variations of phase B are present in the sample, and these can be visually represented by selecting different orange-hues for these distinct phase B variations. Thus, it is possible to use color hues orange-red to yellow (so called compatible colors), for example, for these phase B variations, and a single blue-hue for phase A (so called opposite color). This way, the color hues are still selected from said pre-selected range of consecutive color hues in such a way that the selected color hues comprise mutually corresponding intervals within said pre-selected range of consecutive color hues.

Now still referring to FIG. 5, it can be seen that said ANN comprises, with reference to an HSV color space, at least information with respect to hue and saturation. Most saturated colors (most pure phases, for example) are located at the boundary of the network, and less saturated colors (less pure phases, for example) are located in the center of the network.

Figure 6:
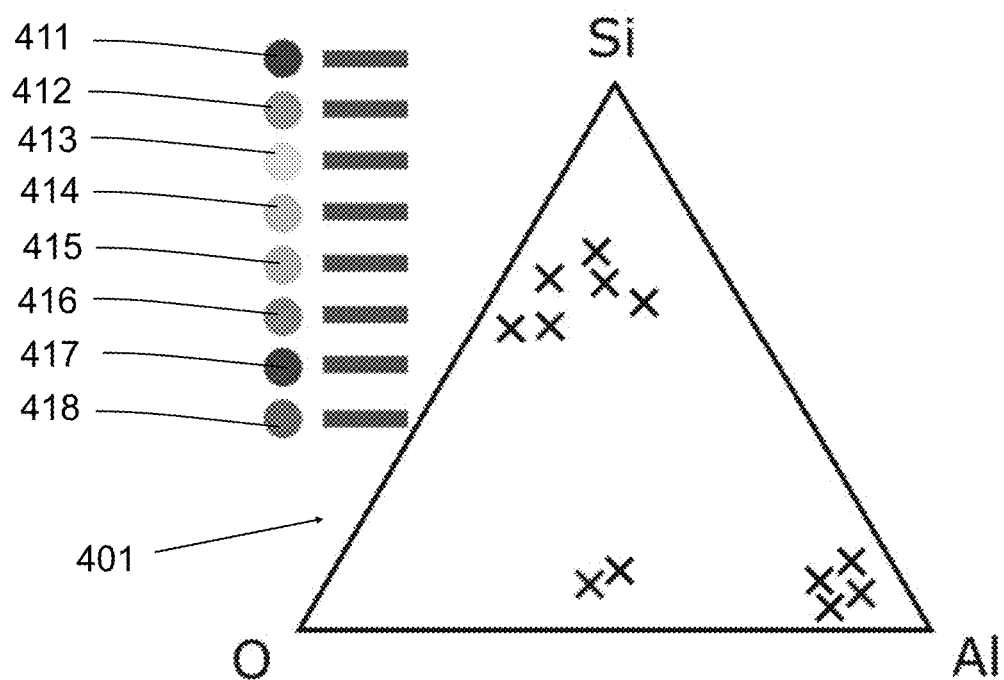
FIG. 6—shows a second embodiment of selecting and assigning color hues to phases.

FIG. 6 shows an embodiment of the method as disclosed herein, in which, compared to FIG. 4, an alternative approach is used. In FIG. 6 a total of eight color hues (red 411, orange 412, yellow 413, green 414, blue-green 415, blue 416, violet 417 and purple 418) are provided, wherein these color hues are associated with specific elements. For example, silicon (Si) can be pre-associated with a red color hue 411, aluminum (Al) can be pre-associated with a purple color hue 418, and oxygen (O) can be pre-associated with a green color hue 414. Once the data is coming in, and it turns out that Si, Al and O are present as elements in the sample, the corresponding color hues red, purple, and green may be provided as the pre-selected range of consecutive color hues. In other words, only three possible color hues red, purple and green are provided in this case. Now, as shown in FIG. 6 with x-marks in the triangle 401, different phases are present, and different color hues can be selected from the pre-selected range of consecutive color hues (red, purple, green) in such a way that the selected color hues comprise mutually corresponding intervals within said pre-selected range of consecutive color hues. A mixing or shift of the color hues is conceivable in this respect for establishing mutually corresponding hue interval angles. For instance, it can be seen in FIG. 6 that the clusters of x-marks (each cluster denoting a similar phase) are positioned within the triangle in such a way that substantially corresponding color hue interval angles are present between them. Thus, the final image does have corresponding hue interval angles for each cluster of phases present in the sample.

Figure 7:
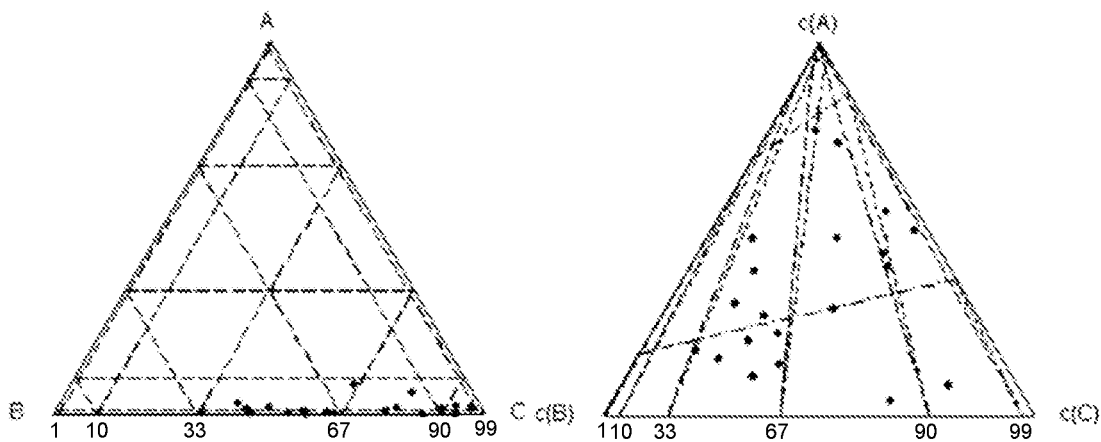
FIG. 7—shows an embodiment wherein normalizing color properties is used.

It is furthermore conceivable that based on information on the plurality of mutually different phases, the method comprises the step of normalizing color properties. FIG. 6 shows that the color space is a bit condensed with respect to the full color space (triangle). FIG. 7 (left hand side) shows an example where the different phases are quite condensed in between the B and C edges of the color space. By normalizing color properties, which may include normalizing hue, value and/or saturation, it is possible to extend the use of color in the final image representation. In this regard, it is noted that the colors used (dots) in FIG. 7 (right hand side) after normalizing provide an extension over the color space. Thus, image representation of the sample is more information dense and more legible for a user.

FIG. 7 is adapted from: Pawlowsky-Glahn, Egozcue, Tolosana-Delgado: Lecture Notes on Compositional Data Analysis (http://www.sediment.uni-goettingen.de/staff/tolosana/extra/CoDa.pdf, p. 36, under reference to MARTIN-FERNÁNDEZ, Josep A., et al. A measure of difference for compositional data based on measures of divergence. In: Proceedings of IAMG. 1999. p. 211-216.) Both the lecture notes by Pawlowsky-Glahn et al. and the proceeding by MARTIN-FERNÁNDEZ et al. are incorporated herein by reference in its entirety and for all purposes.

Figure 8:
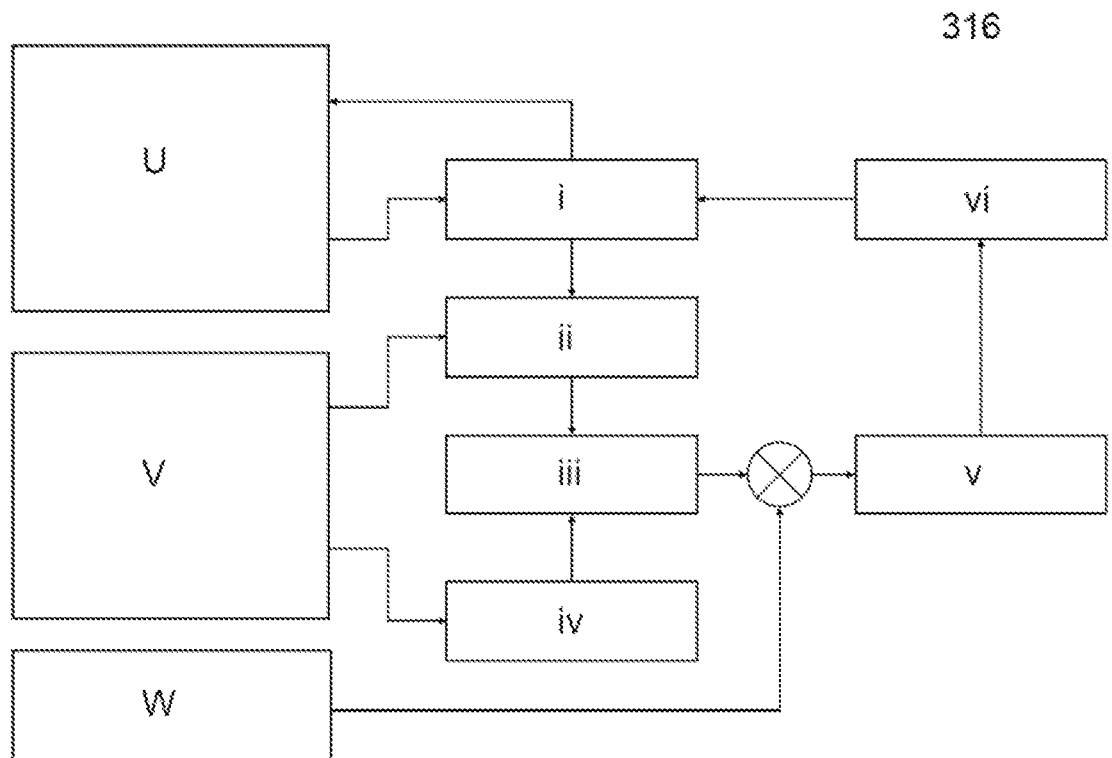
FIG. 8—shows an embodiment of an algorithm for selecting and assigning color hues to phases.

FIG. 8 shows an embodiment of an aspect of the method as disclosed herein. FIG. 8 schematically shows an embodiment of an algorithm that can be used for assigning color hues to detected phases. Blocks U, V, W generally denote a user interface block U, a detector block V, and a processor block W. These blocks U, V, W provide inputs for the algorithm that is generally denoted by algorithm blocks i-vi. Here, the algorithm comprises the steps of generalization of an intermediate color scheme in algorithm block i, the rendering of negative adjustments ii and positive adjustments iv for generating preference adjustments in algorithm block iii, and the generating of final preferences v using both preference adjustments and global preferences coming from the processor block W. With the final preferences v it is possible to assign a color to a certain phase vi, with which the intermediate color scheme i can be updated again. The intermediate color scheme generated this way is output to the User Interface block U to provide the final color scheme.

User interface block U may provide user preferences to the intermediate color scheme i. Detector block V may provide information on the integral composition, phase overlap statistics, and/or other variables related to detection characteristics of the sample to provide negative and/or positive adjustments ii, iv. Processor block W may provide global preferences to the algorithm.

In general, the algorithm may use the following steps:
1. Place "locked" elements in the intermediate color scheme i, wherein the locked elements are provided by a user through the user interface block U;
2. Pick the next unplaced element that has the largest proportion within the sample;
3. Decrease the preference for colors that are already occupied;
4. Increase preference for colors that are compatible with co-occurring elements that were already placed, e.g. having the largest or corresponding hue interval angles;

5. Combine these preference adjustments iii with global preferences coming from the processor unit block W to generate the final preferences v;
6. Pick a color according to the final preferences ("place the element") vi;
7. Repeat steps 2-6 until all detected elements or phases are placed, wherein it is conceivable that negative adjustments and/or positive adjustments are made, for example by equalizing weights according to the integral composition.

Hence, in the embodiment shown in FIG. 8, a pre-selected range of consecutive color hues is provided, and one or more adjustment variables are provided, using at least spectral information of detected emissions of the first type. Based on these adjustment values, said plurality of different color hues is selected from said pre-selected range of consecutive color hues. Finally, said selected color hues are associated to said plurality of mutually different phases.

It is noted that increasing and decreasing in steps 3 and 4, respectively, is similar to the positive iv and negative ii adjustments mentioned before with respect to FIG. 8.

Figure 9:
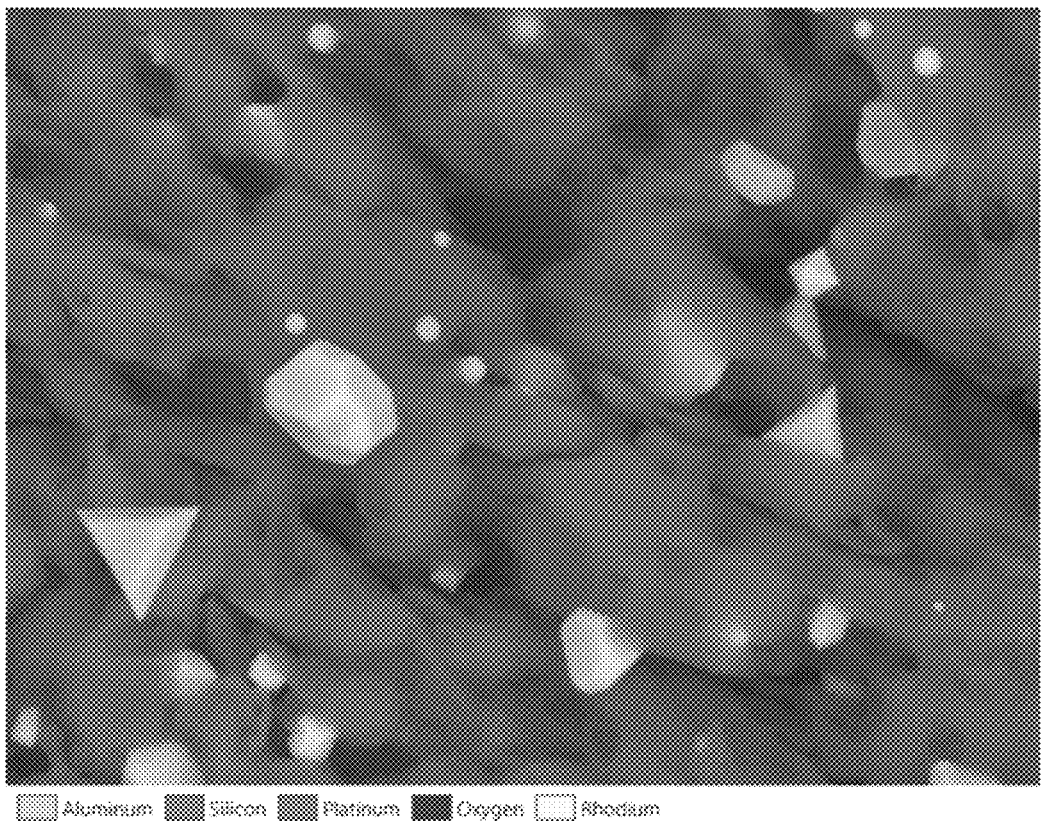
FIG. 9—shows an image representation of a sample, using the method as disclosed herein.

FIG. 9 shows a black and white version of an image representation of the sample, in this case platinum-rhodium particles on ceramics (Si, Al, O). The image representation contains different color hues that are selected by a method as disclosed herein. Color hues comprise blue-green for aluminum, blue for silicon, orange for platinum, purple for oxygen, and yellow for rhodium. Platinum and rhodium are similar phases, and are assigned compatible color hues yellow and orange. Si, Al, and O are different phases, and are assigned blueish hues to maximize the hue interval angles used in the image representation. The result is a clear and legible view of the Pt-Rh particles, giving increased information about the sample.

Several embodiments of the method have been disclosed herein. The desired protection is determined by the appended claims.

The invention claimed is:

1. A method of examining a sample using a charged particle microscope, comprising the steps of:
   Providing a pre-selected range of consecutive color hues;
   Providing a charged particle beam;
   Scanning said charged particle beam over said sample;
   Detecting, using a first detector, emissions from the sample in response to the beam scanned over the sample;
   Assigning a plurality of mutually different phases to said sample based on spectral information of the detected emissions;
   Selecting a plurality of different color hues from said pre-selected range of consecutive color hues in such a way that the selected color hues comprise mutually corresponding intervals within said pre-selected range of consecutive color hues;
   Associating, with reference to an HSV color space, said selected different color hues to said plurality of mutually different phases; and
   Providing, by a control unit, an image representation of said sample, wherein said image representation contains said associated different color hues.

2. The method according to claim 1, wherein the step of selecting said plurality of different color hues comprises using information on the plurality of mutually different phases as an input variable.

3. The method according to claim 1, comprising repeating said steps of selecting said plurality of different color hues, and associating said re-selected color hues to said plurality of mutually different phases.

4. The method according to claim 1, comprising the step of using an artificial neural network (ANN) for selecting and associating said plurality of different color hues.

5. The method according to claim 4, comprising the step of using a self-organizing map (SOM) as said artificial neural network.

6. The method according to claim 5, wherein said SOM includes a network of nodes, and wherein using said SOM includes using different nodes of said network of nodes to represent different phases.

7. The method according to claim 5, wherein said SOM includes a network of nodes, and wherein using said SOM includes corresponding an outer edge of said network of nodes to said pre-selected range of consecutive color hues.

8. The method according to claim 5, wherein said SOM includes a network of nodes, and the method further comprising associating a saturation to the network of nodes, wherein most saturated colors are located at the boundary of the network, and less saturated colors are located in the center of the network.

9. The method according to claim 4, further comprising initiating said ANN by associating one or more selected color hues to one or more phases of pure elements.

10. The method according to claim 4, further comprising the step of initializing said ANN to include a number of pre-selected phases as corresponding pre-selected nodes.

11. The method according to claim 4, comprising the step of training said ANN, wherein said step of training in particular comprises the step of matching said ANN to said assigned plurality of mutually different phases.

12. The method according to claim 1, further comprising the step of pre-assigning a specific color hue to a specific phase of a pure element.

13. The method according to claim 1, comprising the step of normalizing color properties based on information on the plurality of mutually different phases.

14. The method of claim 13, wherein the plurality of different color hues have a fixed hue interval.

15. The method of claim 14, wherein the fixed hue interval is the golden angle.

16. A method of examining a sample using a charged particle microscope, comprising:
   Providing a pre-selected range of consecutive color hues;
   Scanning said sample with a charged particle beam;
   Detecting emissions from the sample in response to the beam scanned over the sample;
   Assigning a plurality of mutually different phases to said sample based on spectral information of the detected emissions;
   Providing one or more adjustment variables, using at least spectral information of the detected emissions;
   Selecting a plurality of different color hues from said pre-selected range of consecutive color hues based on said adjustment variables; and
   Associating said selected different color hues to said plurality of mutually different phases.

17. A charged particle microscope for examining a sample, comprising:
   an optics column, including a charged particle source, a final probe forming lens and a scanner, for focusing a beam of charged particles emitted from said charged particle source onto a specimen;

a specimen stage positioned downstream of said final probe forming lens and arranged for holding said specimen;

a detector for detecting emissions from said specimen in response to the incidence of charged particles emitted from said charged particle source;

a control unit and a processing device connected to said first detector, the control unit is configured to:
provide a pre-selected range of consecutive color hues;
scan said sample with the charged particle beam;
detect emissions with the detector;
assign a plurality of mutually different phases to said sample based on spectral information of the detected emissions;
select a plurality of color hues from said pre-selected range; and
associate said selected color hues to said plurality of mutually different phases.

18. The charged particle microscope of claim 17, the control unit is further configured to associate similar phases with compatible color hues.

* * * * *